United States Patent
Takeuchi et al.

(10) Patent No.: US 7,145,283 B2
(45) Date of Patent: Dec. 5, 2006

(54) PIEZOELECTRIC DEVICE AND METHOD FOR MANUFACTURING THE SAME

(75) Inventors: Manabu Takeuchi, Nagano-ken (JP);
Katsumi Takayama, Nagano-ken (JP);
Osamu Kawauchi, Shiojiri (JP);
Yusuke Kinoshita, Nagano-ken (JP)

(73) Assignee: Seiko Epson Corporation (JP)

( * ) Notice: Subject to any disclaimer, the term of this patent is extended or adjusted under 35 U.S.C. 154(b) by 132 days.

(21) Appl. No.: 10/697,632

(22) Filed: Oct. 29, 2003

(65) Prior Publication Data

US 2004/0160145 A1 Aug. 19, 2004

(30) Foreign Application Priority Data

Oct. 29, 2002 (JP) ............... 2002-314321

(51) Int. Cl.
*H01L 41/053* (2006.01)
*H03H 9/25* (2006.01)

(52) U.S. Cl. ...................... 310/348; 310/348

(58) Field of Classification Search ............ 310/313 R, 310/348
See application file for complete search history.

(56) References Cited

U.S. PATENT DOCUMENTS

| | | | | |
|---|---|---|---|---|
| 5,900,790 A | * | 5/1999 | Unami et al. ............... | 333/187 |
| 5,929,553 A | * | 7/1999 | Suzuki et al. ............... | 310/355 |
| 5,998,909 A |   | 12/1999 | Kumasaka et al. | |
| 6,303,219 B1 | * | 10/2001 | Sawamura et al. ......... | 428/343 |
| 6,326,243 B1 | * | 12/2001 | Suzuya et al. .............. | 438/124 |
| 6,396,201 B1 | * | 5/2002 | Ide et al. .................... | 310/353 |

FOREIGN PATENT DOCUMENTS

| | | |
|---|---|---|
| CN | 1197549 A | 5/1997 |
| JP | 63-160239 | 7/1988 |
| JP | 5-121492 | 5/1993 |
| JP | 5-76048 | 10/1993 |
| JP | 05-76048 | 10/1993 |
| JP | 6-104679 | 4/1994 |
| JP | 8-79002 | 3/1996 |
| JP | 9-116049 | 5/1997 |
| JP | 09-116049 | 5/1997 |
| JP | 9-246682 | 9/1997 |
| JP | 09-246683 | 9/1997 |
| JP | 10-32455 | 2/1998 |
| JP | 11251863 | 9/1999 |
| JP | 2000-165190 | 6/2000 |
| JP | 2000-295039 | 10/2000 |
| JP | 2002-314321 | 10/2002 |

OTHER PUBLICATIONS

Japanese Utility Model Publication No. 4-3281 in Japanese only, 3 pages in total.
Japanese Utility Model Laid Open No. 6-81139 in Japanese only, 4 pages front and back in total.

(Continued)

*Primary Examiner*—Thomas M. Dougherty
(74) *Attorney, Agent, or Firm*—Anderson Kill & Olick, PC

(57) ABSTRACT

A piezoelectric device and method comprising a piezoelectric vibrating reed 10 and excitation electrodes which are mounted in a package having a package base 42 and outer terminals using a TAB tape 20 composed of a plurality of electrical conductors formed on an insulating material with each of the plurality of electrical conductors disposed in an arrangement forming predetermined winding patterns 30 thereon with the wiring patterns 30 interconnecting the excitation electrodes to the outer terminals.

7 Claims, 15 Drawing Sheets

OTHER PUBLICATIONS

Office Action which issued in the corresponding Chinese Patent Application, citing above references.

Japanese Patent Office action which issued in the corresponding Japanese patent application, citing the above references.

* cited by examiner

PIEZOELECTRIC DEVICE AND METHOD FOR MANUFACTURING THE SAME

TECHNICAL FIELD OF THE INVENTION

The present invention relates to a piezoelectric device and a method for manufacturing the same.

BACKGROUND OF THE INVENTION

FIGS. 14(A & B) illustrate a prior art surface acoustic wave (hereinafter referred to as SAW) resonator, which is an example of a piezoelectric device. FIG. 14(A) is a plan view of the SAW resonator with the lid 548 of FIG. 14(B) removed. FIG. 14(B) is a side sectional view taken along line M—M of FIG. 14(A). Piezoelectric devices are widely used for providing a constant frequency in electrical circuits. The SAW resonator 500 of FIG. 14(A), which illustrates the typical construction of a piezoelectric device, is manufactured by mounting a SAW resonating reed 510 in a package 540. Outer electrodes 552 disposed at the back side of the package 540 are electrically connected to interdigital transducer electrodes (hereinafter referred to as IDT electrodes) 512 disposed on the SAW resonating reed 510.

A pair of the IDT electrodes 512, which function as excitation electrodes to energize a surface acoustic wave resonator, is formed on the SAW resonating reed 510. Electrode pads 516 for the IDT electrodes 512 are also disposed on the SAW resonating reed 510 and are connected to the IDT electrodes 512. A package base 542 includes a cavity 544 for mounting the SAW resonating reed 510. The cavity 544 in the package base 542 preferably forms a stepped pattern along the sidewalls of the package base 542. A plurality of wire bonding pads 556 is formed on the middle step in the vicinity of electrode pads 516. The number of wire bonding pads 556 corresponds to that of the electrode pads 516 on the SAW resonating reed 510. Wiring patterns are formed on the package base 542 ranging from the wire bonding pads 556 to the outer electrodes 552. The electrode pads 516 are connected to the IDT electrodes and the wire bonding pads 556 by wires 550. Accordingly, the outer electrodes 552 of the package are electrically connected to the IDT electrodes 512 on the SAW resonating reed 510.

The SAW resonating reed 510 is mounted on the bottom of the cavity 544 of the package base 542 with an adhesive 538 such as a silver paste or a silicone resin paste. Furthermore, a lid 548 is installed at the opening of the cavity 544, thereby sealing the package 540 and keeping the SAW resonating reed 510 in an atmosphere such as nitrogen. Particles in the air are not deposited on the IDT electrodes 512, thereby preventing variation of the resonant frequency in the SAW resonator 500 over time.

FIGS. 15(A & B) illustrate a SAW filter, which is another example of a piezoelectric device of the prior art. FIG. 15(A) is a plan view of the SAW filter without a cover lid. FIG. 15(B) is a side sectional view taken along line P—P of FIG. 15(A). Two pairs of IDT excitation electrodes 612 and 613 may be formed on a SAW resonating reed 610 in a SAW filter 600. In yet other piezoelectric device(s), the excitation electrodes may be arranged in various patterns formed on the surface of the piezoelectric vibrating reed. The pattern of arrangement of the electrode pads for the excitation electrodes will vary accordingly. Wire bonding pads corresponding to the various types of electrode pads have to be formed on the package base. Unfortunately, to accommodate the different patterns various kinds of package base(s) are therefore required which makes a reduction in cost difficult to achieve.

PROBLEMS TO BE SOLVED BY THE INVENTION

Referring back to FIG. 14, the SAW resonating reed 510 and package base 542 are bonded by an adhesive 538. Unfortunately, if a piezoelectric vibrator is used for bonding the piezoelectric vibrating reed to the package base, the impact force causes mechanical connection breakage at the bonded portion with the piezoelectric vibrating reed. When the piezoelectric vibrator is heated and cooled, both the piezoelectric vibrating reed and the package are expanded and constricted accordingly. Since the piezoelectric vibrating reed and the package have different coefficients of linear expansion, the individual rates of expansion and rates of contraction are different. Unfortunately, the sheer stress developed at the bonded portion of the piezoelectric vibrating reed causes mechanical connection breakage. Furthermore, if the piezoelectric vibrating reed and the package are electrically connected at the bonded portion, electrical connection breakage also occurs. Based on the above described conventional method for manufacturing piezoelectric devices, even if connection breakage of the piezoelectric vibrating reed is prevented, one common package base cannot be used for all piezoelectric devices.

The heating of the piezoelectric device causes evaporation of an organic solvent in the adhesive used for connecting the piezoelectric vibration reed mounted in the package and the package. This solvent adheres to components such as the excitation electrodes of the piezoelectric vibrating reed. Unfortunately, such a phenomenon shifts the resonant frequency of the piezoelectric vibration reed.

OBJECTS OF THE INVENTION

In view of the problems described above, it is an object of the present invention to provide a piezoelectric device and method of manufacture in which one common package base can be used for manufacturing all piezoelectric devices; breakage of the connection with the piezoelectric vibrating reed will not occur, and a shift in resonant frequency by adhesion of impurity gas can be avoided.

SUMMARY OF THE INVENTION

The piezoelectric device according to the present invention includes a piezoelectric vibrating reed mounted in a package with the vibrating reed having excitation electrodes electrically connected to outer terminals of the package by means of an insulating bonding tape ("TAB") having a plurality of wiring patterns thereon in which the insulating bonding tape (TAB) is used for interconnecting the excitation electrodes of the piezoelectric vibrating reed with the outer terminals of the package through the plurality of wiring patterns.

Since the wiring patterns are formed directly on the TAB tape, the wiring patterns are not required on the package base. Accordingly, even if a piezoelectric vibrating reed having a different electrode structure is mounted on the package base, the outer electrodes of the package and the piezoelectric vibrating reed can be electrically connected by changing the wiring patterns of the TAB tape. Therefore, a common package can be used for all piezoelectric devices.

The wiring patterns may be formed on the face of the insulating tape facing the package, and the piezoelectric vibrating reed may be mounted on the wiring patterns via windows formed in the insulating tape. In this case, the wiring patterns are formed on only one side of the insulating tape, thereby reducing the cost.

The piezoelectric vibrating reed may be mounted on mounting terminals formed on the TAB tape by raising part of each wiring pattern from the surface of the insulating tape through the windows formed in the insulating tape. In such case, even if an impact force is applied to the piezoelectric device, the mounting terminals function as buffers. Accordingly, connection breakage in the piezoelectric vibrating reed does not occur. Furthermore, even if both the rates of expansion and the rates of contraction of the piezoelectric vibrating reed and the package are different, due to the difference of the coefficients of linear expansion, the mounting terminals absorb the difference of the rates of expansion and the rates of contraction. Accordingly, shear stress does not act on the bonded portion, thereby preventing connection breakage in the piezoelectric vibrating reed.

The mounting terminals may be raised from the center to above the periphery of the insulating tape, and the piezoelectric vibrating reed may be disposed on the mounting terminals of the TAB tape with the piezoelectric vibrating reed mounted on the ends of the mounting terminals. In this case, space is efficiently used compared with the case where the mounting terminals are raised from the periphery to the center of the insulating tape. Therefore, the piezoelectric device can be reduced in size.

The installation of the TAB tape in the package and/or the mounting of the piezoelectric vibrating reed on the TAB tape may be performed using conductor elements, i.e. bumps placed between them without wire bonding. Since wire bonding is not performed in this case, the process is simplified. Furthermore, since the bumps do not give off impurity gases, the shift of the resonant frequency of the piezoelectric vibrating reed due to the release of impurity gas thereon is prevented.

According to the method of the present invention, a piezoelectric vibrating reed is mounted in a package using an insulating bonding tape ("TAB") composed of an insulating tape having wiring patterns thereon for electrically connecting the outer terminals of the package to the excitation electrodes of the piezoelectric vibrating reed by first mounting the vibrating reed on the TAB tape and interconnecting the excitation electrodes to the outer terminals through the plurality of windings on the TAB tape. In this case, the piezoelectric vibrating reeds are successively mounted on the elongated TAB tape, thereby efficiently manufacturing piezoelectric devices.

The method of the present invention for manufacturing a piezoelectric device having a piezoelectric vibrating reed mounted in a package base of the device using a TAB tape composed of an insulating tape having wiring patterns thereon further comprises the step of installing the TAB tape in the package base; and mounting the piezoelectric vibration reed on the TAB tape installed in the package base. Since the TAB tape is installed in the package base and then the piezoelectric vibration reed is mounted on the TAB tape, the outer shape of the TAB tape does not have to be larger than the outer shape of the piezoelectric vibration reed. As a result, the outer shape of the TAB tape can be the same as the outer shape of the piezoelectric vibration reed. Accordingly, a so-called chip-size package is obtained and a reduction in size of the piezoelectric device is achieved.

BRIEF DESCRIPTION OF THE DRAWINGS

Preferred embodiments of a piezoelectric device and a method for manufacturing the same according to the present invention will now be described in detail with reference to the attached drawings. Although a SAW resonator will be described as an example, the piezoelectric device and the method for manufacturing the same according to the present invention may also be applied to other known piezoelectric devices.

REFERENCE NUMERALS

Figure 1A:
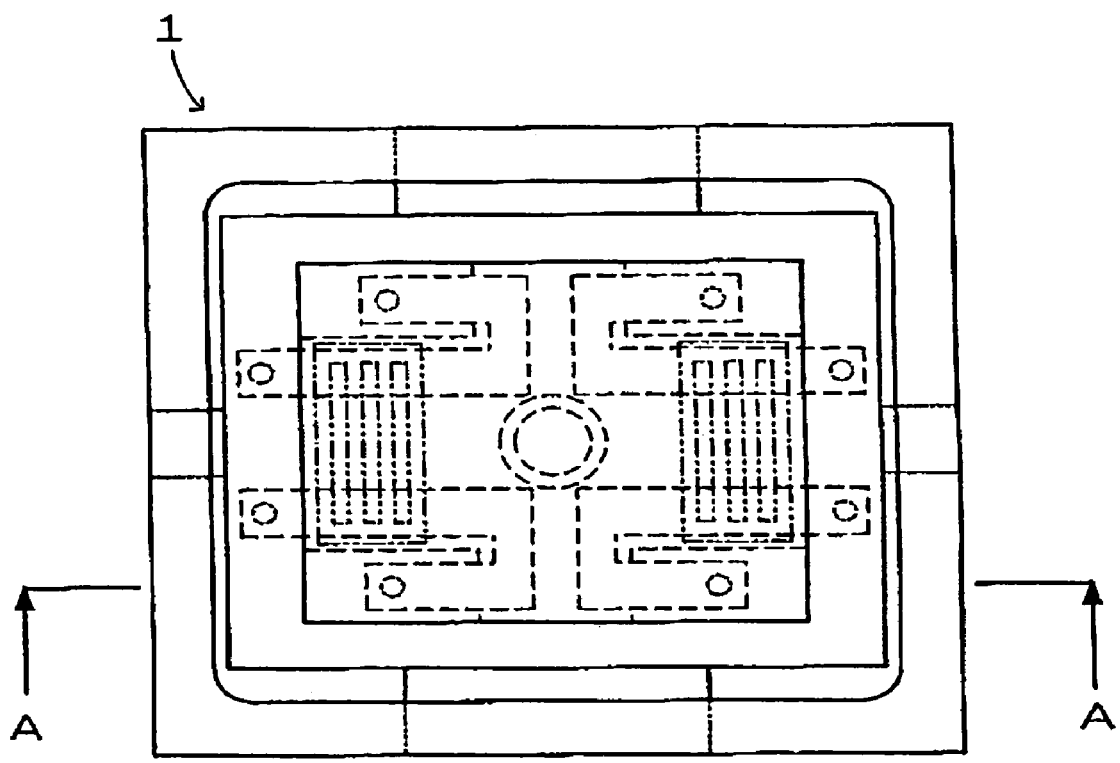
FIGS. 1(A & B) include illustrations of a piezoelectric device according to a first embodiment.

1: piezoelectric device
10: piezoelectric vibrating reed
16: electrode pad
18: bump
20: TAB tape
22: insulating tape
30: wiring pattern
34: mounting terminal
42: package base
52: outer electrode
54: mounting electrode
58: bump

DESCRIPTION OF THE PREFERRED EMBODIMENTS

Figure 1B:
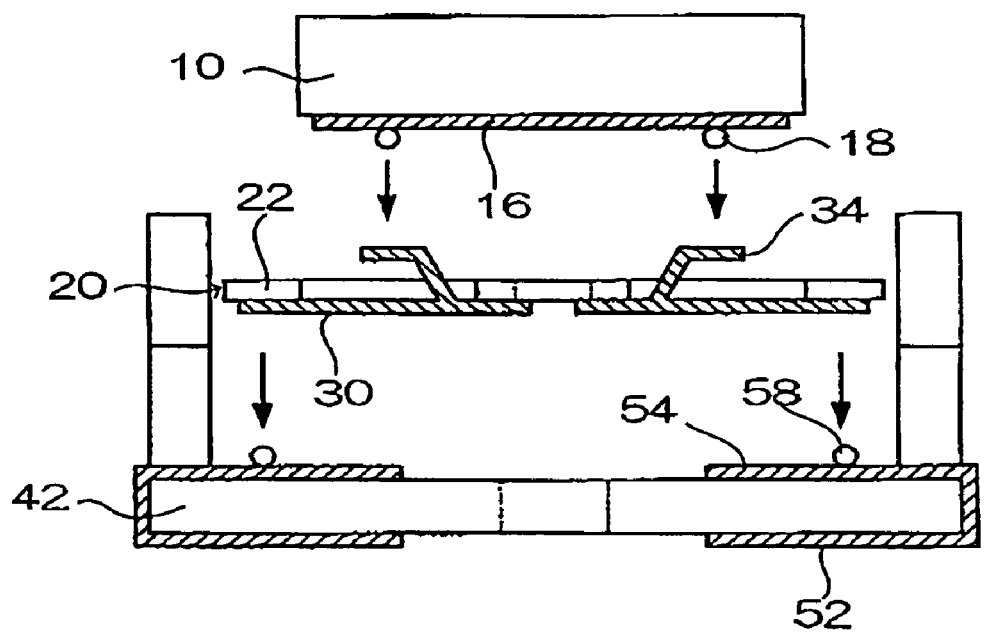

A first embodiment will now be described:

FIGS. 1(A & B) illustrate a piezoelectric device according to the first embodiment. FIG. 1(A) is a plan view and FIG. 1(B) is a side sectional view taken along line A—A of FIG. 1(A). According to the piezoelectric device of the first embodiment, a SAW resonating reed (or a piezoelectric vibrating reed) 10 is mounted in a package base 42 using a tape-automated-bonding (hereinafter referred to as "TAB") tape 20 composed of a tape 22 of insulating material having wiring patterns 30 thereon. A method for manufacturing the piezoelectric device includes a first step of mounting the SAW resonating reed 10 on the TAB tape 20 and a second step of installing the TAB tape 20 having the SAW resonating reed 10 mounted thereon in the package base 42.

Figure 2A:
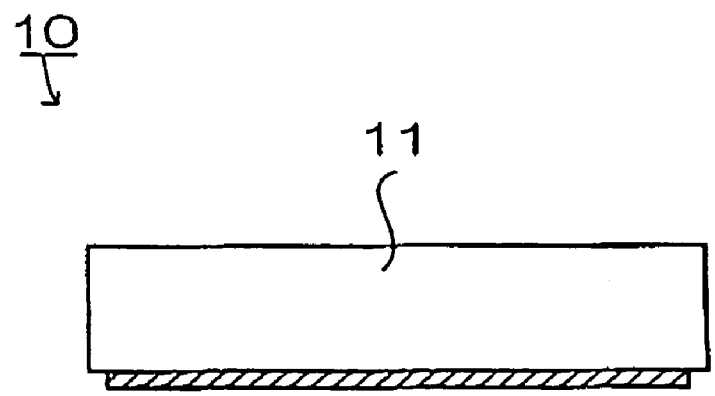
FIGS. 2(A & B) include illustrations of a SAW resonating reed.
Figure 2B:
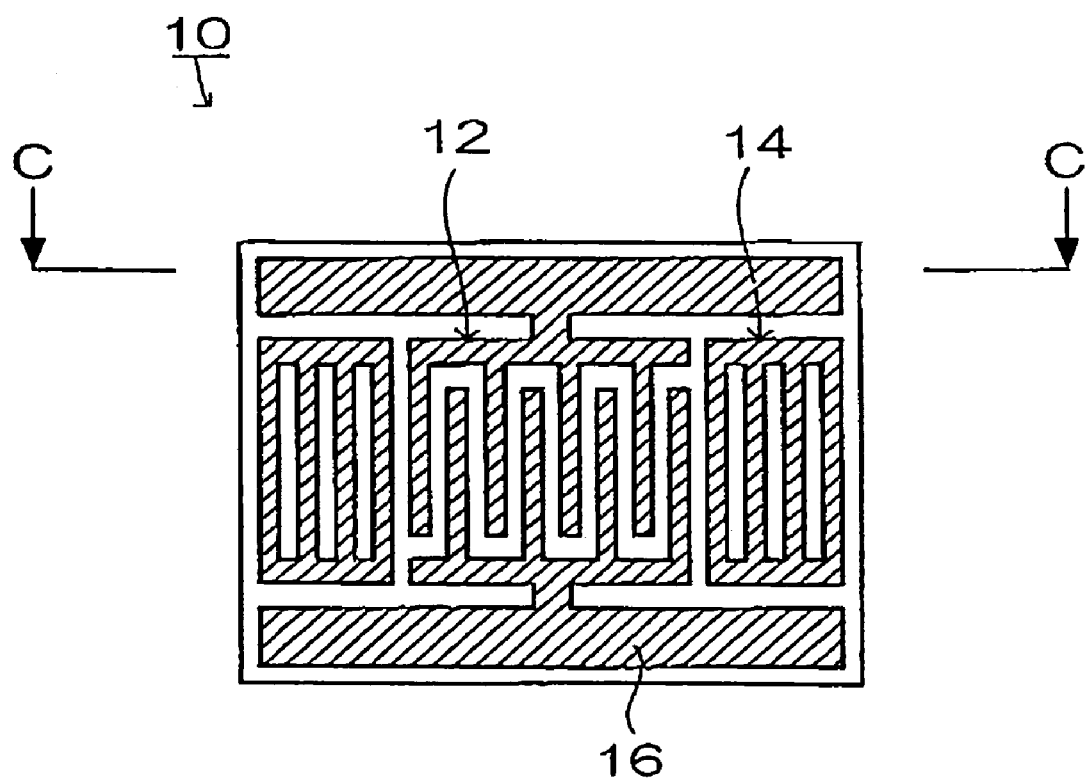

FIG. 2 illustrates a SAW resonating reed. FIG. 2(A) is a side sectional view taken along line C—C of FIG. 2(B) and FIG. 2(B) is a bottom plan view. The SAW resonating reed 10 is composed of, for example, an ST-cut quartz plate 11 having on its main surface aluminum "IDT" electrodes 12 composed of an alternating arrangement of electrodes forming a comb tooth-like shape formed on the center of the ST-cut quartz plate 11 and ladder-shaped reflector electrodes 14 connected at both ends of the IDT electrodes 12. Electrode pads 16 are formed adjacent to each comb tooth-like electrode arrangement and are connected to each comb tooth-like electrode arrangement.

Figure 3A:
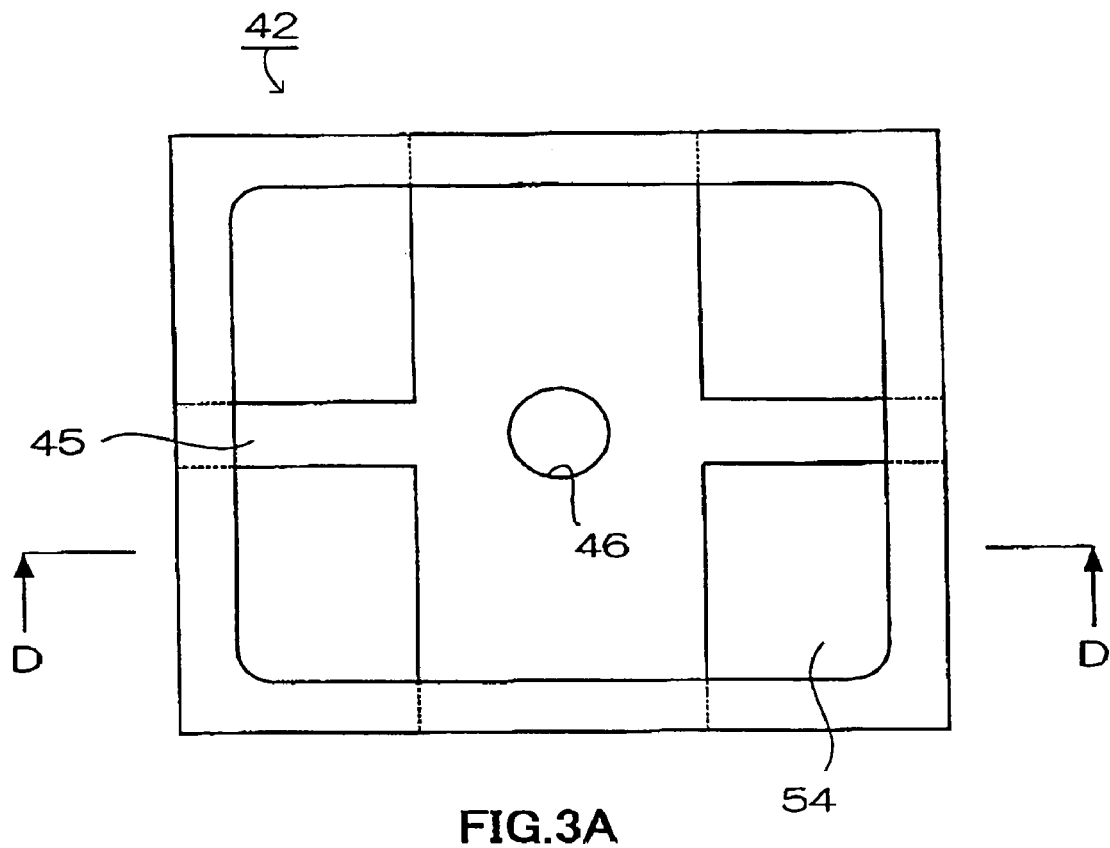
FIGS. 3(A & B) include illustrations of a package base.
Figure 3B:
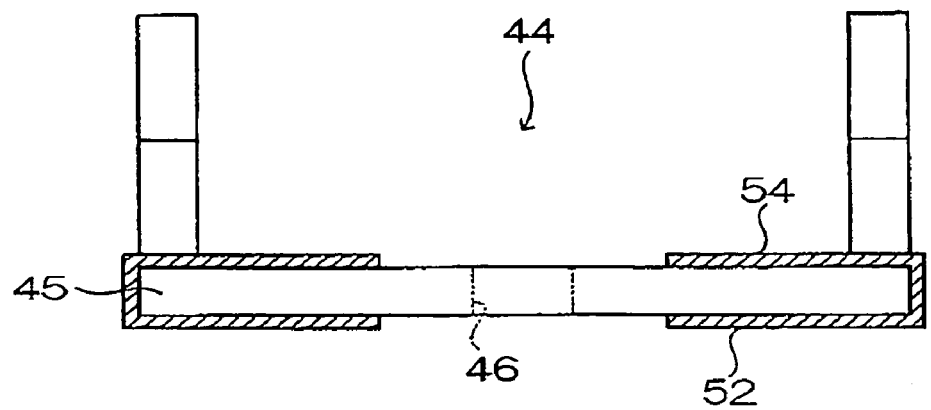

FIG. 3(A) is a plan view illustrative of a package base 42. FIG. 3(B) is a side sectional view taken along line D—D of FIG. 3(A). In order to manufacture the package base 42, a plurality of sheets made of, for example, ceramic is processed to prepare blanks having a desired shape and then the blanks are laminated. A cavity 44 for mounting the SAW resonating reed is formed in the package base 42. At the bottom center of the cavity 44 an open hole 46 is formed for ventilating the package. The bottom of the cavity 44 is composed of a base sheet 45 on which electrode are formed by, for example, Ni and Au plating having a desired pattern. Specifically, outer electrodes 52 are formed at the four corners on the bottom face of the base sheet 45. Mounting electrodes 54 are formed at four corners on the top face of the base sheet 45. Electrodes are also formed on the side faces of the base sheet 45, thereby electrically connecting the outer electrodes 52 and the mounting electrodes 54.

Figure 4A:
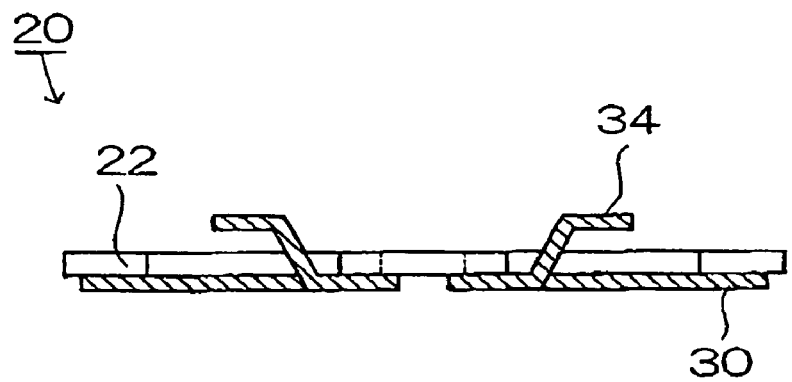
FIGS. 4(A & B) include illustrations of a TAB tape.
Figure 4B:
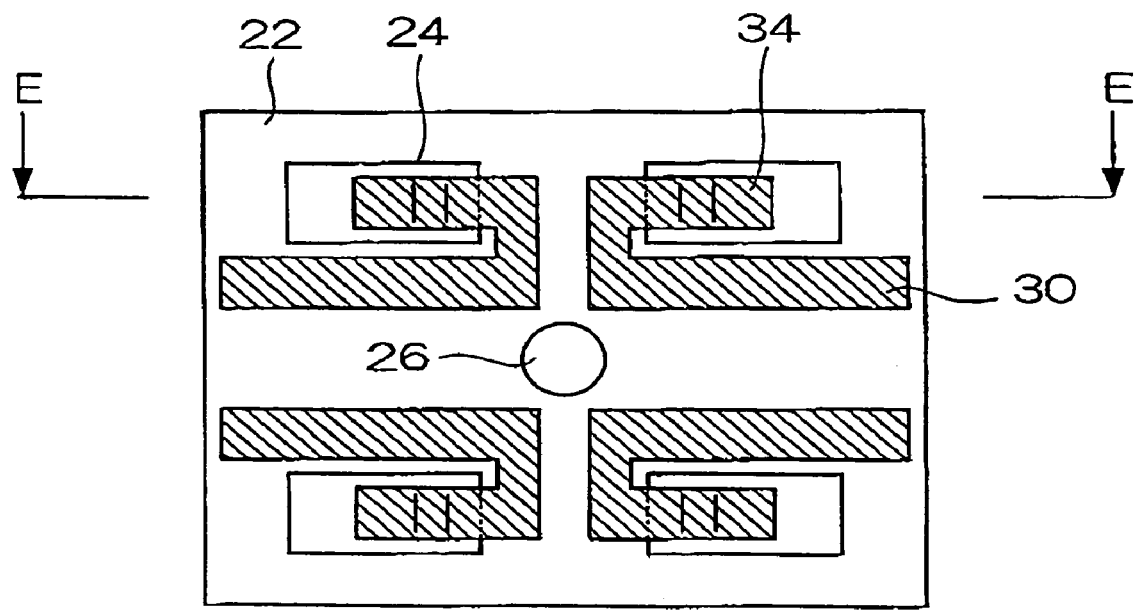

FIGS. 4(A & B) illustrate a TAB tape 20 to be used in the manufacturing process of the present invention. FIG. 4(A) is a side sectional view taken along line E—E of FIG. 4(B) and FIG. 4(B) is a bottom plan view of the TAB tape. The TAB tape 20 is an insulating tape 22 of preferably rectangular configuration composed of, for example, polyimide resins. The polyimide resin is readily manufactured by polycondensation of tetracarboxylic acids and diamines. The characteristics of the resin, such as coefficient of linear expansion, Young's modulus, heat sealing properties, and moisture absorptivity, are varied by modifying each of the molecular structures. If the coefficient of linear expansion of the insulating tape 22 is similar to that of the package 42, sheer stress will not act on the bonded portion of the package and the insulating tape. Accordingly, connection breakage in the insulating tape will not occur. At the center of the insulating tape 22 is an open hole 26 used for ventilating the package. A plurality of windows 24 are formed in the tape 22 close to the four corners of the insulation tape 22 for mounting a SAW resonating reed. The windows 24 are formed with a configuration corresponding to the configuration of the electrode pads 16 (referring to FIG. 2) of the SAW resonating reed 10 mounted on the TAB tape 20 and thus the shape of window 24 is preferably rectangular.

Wiring patterns 30 are formed on the insulating tape 22, for example, using a copper foil. The wiring patterns 30 are formed to extend longitudinally inside the windows 24. The copper foil wiring patterns 30 linearly extend from the periphery adjacent the long sides of the tape to approximately the center of the insulating tape 22, and then to extend from the approximate center of the insulating tape 22 toward the inside short sides of the windows 24 such that the wiring pattern 30 forms a curve preferably of a U shape. The copper foil wiring patterns 30 extending over the windows are then raised from the inside of the short sides of the windows 24 to the back side of the insulating tape 22 passing through the windows 24, thereby forming mounting terminals 34 as shown in FIG. 4A in an elevated portion relative to the position of the tape 22.

Figure 5A:
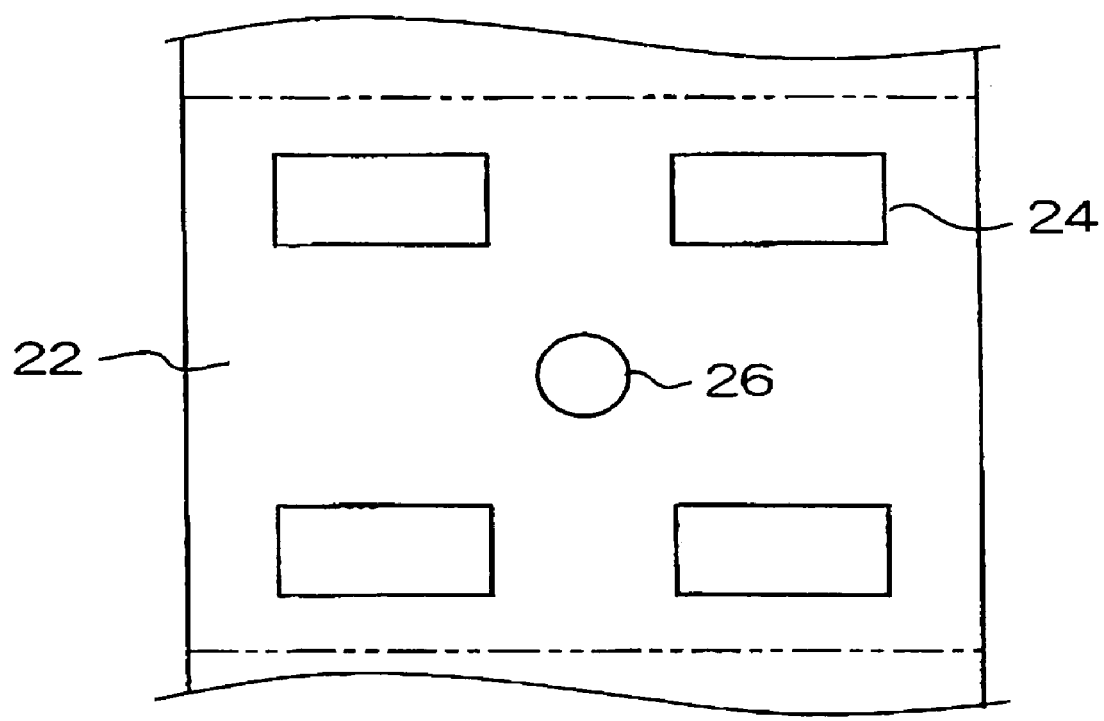
FIGS. 5(A & B) include illustrations of a manufacturing method of the TAB tape.
Figure 5B:
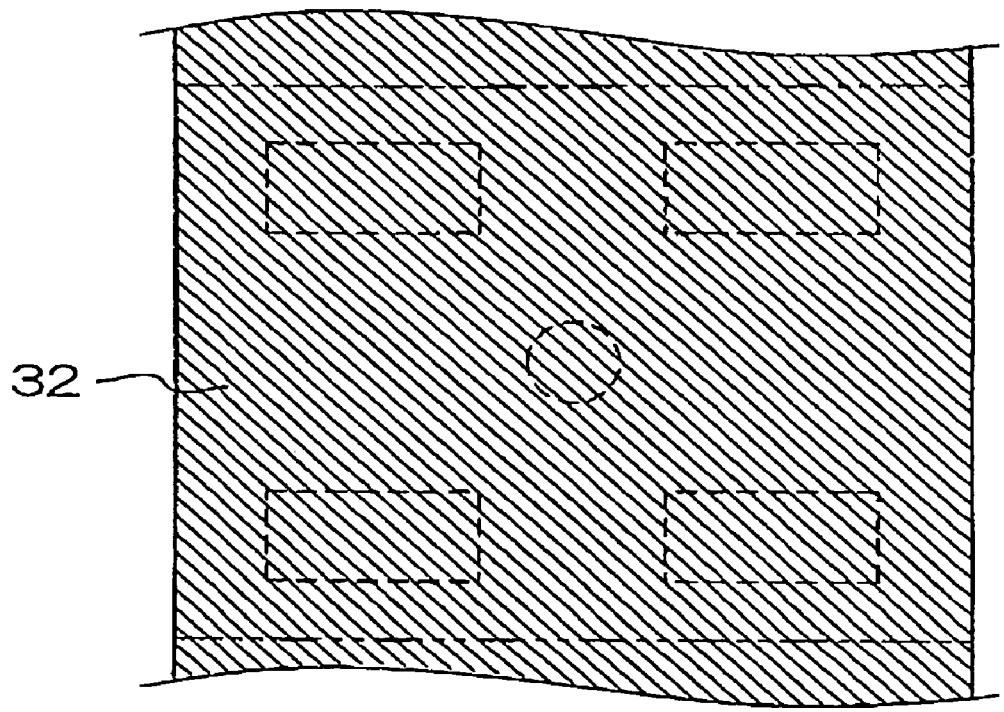
Figure 6A:
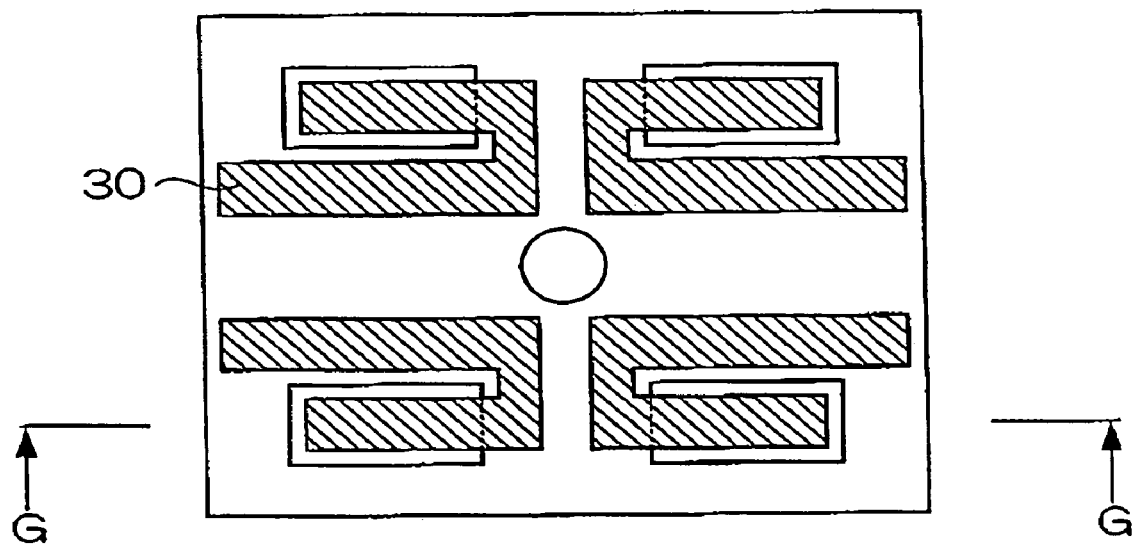
FIGS. 6(A & B) include illustrations of a manufacturing method of the TAB tape.
Figure 6B:
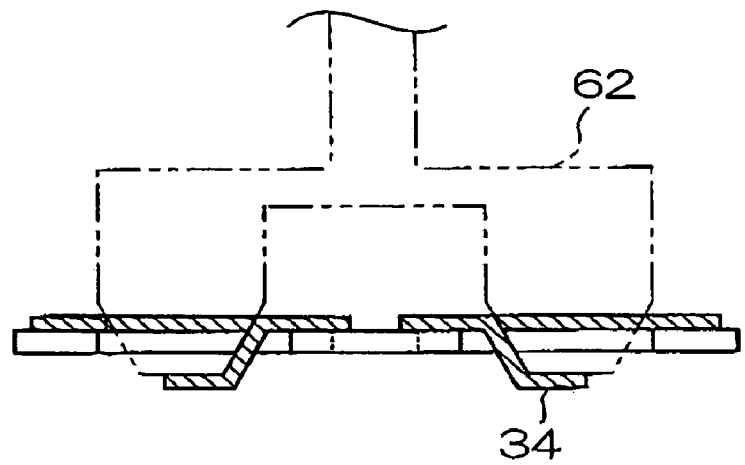

FIGS. 5(A & B) and 6(A & B) illustrate preferred method for manufacturing the TAB tape 20. FIG. 5(A), FIG. 5(B), and FIG. 6(A) are bottom plan views, as in FIG. 4(B). FIG. 6(B) is a side sectional view taken along line G—G of FIG. 6(A). The manufacturing method of the TAB tape will now be specifically described. Referring to FIG. 5(A), windows 24 and the open holes 26 are formed at predetermined positions in an elongated strip of insulating tape 22 to provide a blank. Referring to FIG. 5(B), a metal foil 32 composed of, for example, copper is formed on the entire surface of the insulating tape 22 by sputtering, vapor deposition, casting, fusion, or pasting with adhesive. Then, a mask corresponding to the wiring pattern 30 is formed by photolithography. The metal foil 32 is etched via the mask and the mask is removed, thus forming the wiring patterns 30 made of the metal foil as shown in FIG. 6(A). Referring to FIG. 6(B), the portion of wiring patterns 30 which extend over the windows 24 are bent, passed through the windows, and raised to the back side of the insulating tape, thereby forming the mounting terminals 34. As described later, according to the first embodiment, the step of forming the mounting terminals 34 can be performed simultaneously with a step of mounting the SAW resonating reed on the TAB tape. A bonding tool 62 for mounting is used as a bending tool for the wiring pattern.

Referring to the FIG. 1(B), the SAW resonating reed 10 is mounted on the TAB tape 20, and the TAB tape 20 is installed on the package base 42. The SAW resonating reed 10 is arranged such that the face having the electrodes 12, 14 is disposed at the lower side. Gold or solder bumps 18 are formed on the electrode pads 16 of the SAW resonating reed 10 and are connected to the mounting terminals 34 of the TAB tape 20. The TAB tape 20 is arranged such that the face upon which the wiring patterns 30 were formed is disposed at the lower side. The ends of the wiring patterns 30 are connected to bumps 58 formed on the mounting electrodes 54 of the package base 42. The bumps 58 are likewise composed of, for example, gold or solder. Unlike adhesives, the bumps 18 and 58 do not give off impurity gases. Therefore, no shift in the resonant frequency of the SAW resonating reed will occur due to the deposition of the bumps 18 and 58. As described above, the outer electrodes 52 disposed at the package base 42 are electrically connected to the IDT electrodes 12 disposed on the SAW resonating reed 10 (refer to FIG. 2). Then a lid 48 as will be discussed hereafter in connection with FIG. 8 is installed at the opening of the cavity of the package base 42, thereby enclosing the cavity 44 for maintaining, for example, a nitrogen atmosphere inside the cavity.

Figure 7A:
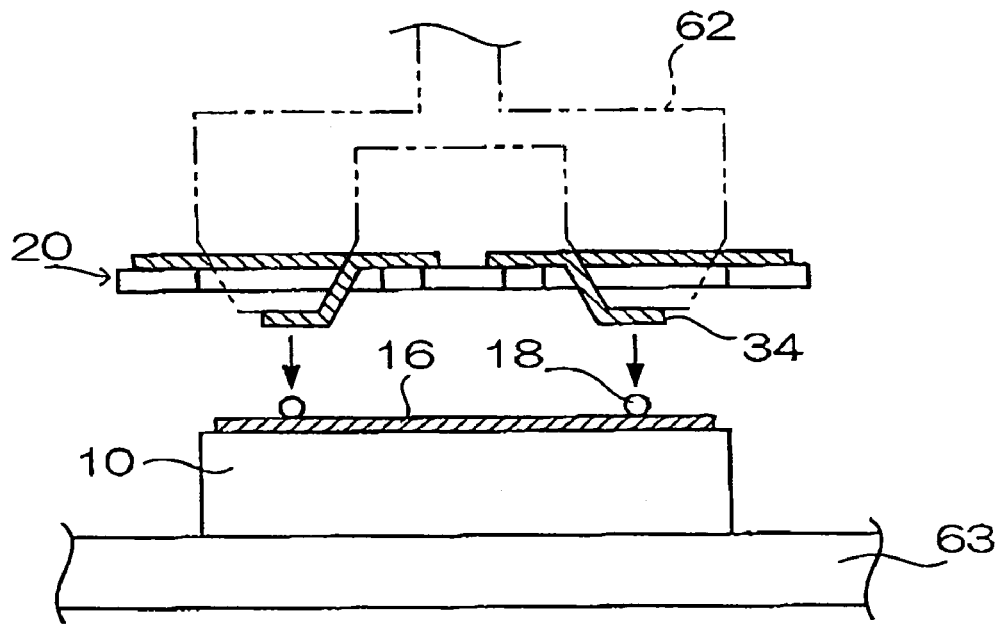
FIGS. 7(A & B) include illustrations of a manufacturing method of the piezoelectric device according to the first embodiment.
Figure 7B:
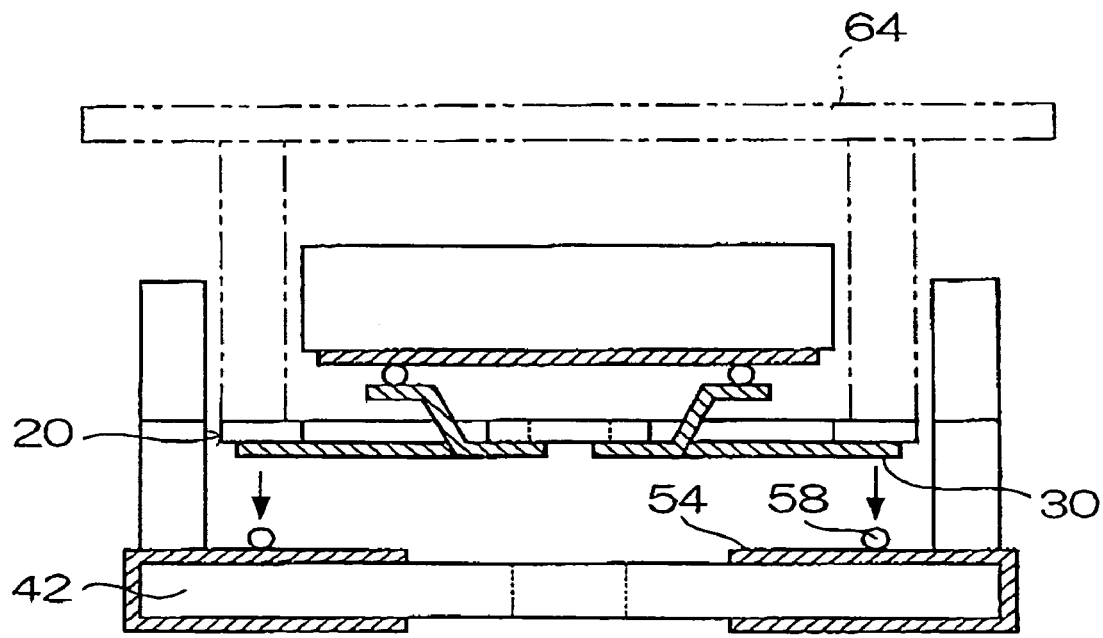

FIGS. 7(A & B) and 8(A & B) illustrate a method for manufacturing the piezoelectric device according to the first embodiment of the present invention. FIGS. 7(A), 7(B), 8(A), and 8(B) are side sectional views of the device of FIGS. 1(A & B) taken along line A—A of FIG. 1(A). An outline of the manufacturing method of the piezoelectric device according to the first embodiment includes the first step of mounting the SAW resonating reed 10 on the TAB tape 20 and the second step of installing the TAB tape 20 having the SAW resonating reed 10 mounted thereon in the package base 42.

Referring to FIG. 7(A), in the first step, the SAW resonating reed 10 is mounted on the TAB tape 20. More specifically, the bumps 18 formed on the surfaces of the electrode pads 16 (refer to FIG. 2) are formed on the SAW resonating reed 10 by an apparatus for forming stud bumps using a metal wire. The bumps 18 are formed at the positions corresponding to the ends of the mounting terminals 34 formed in the TAB tape 20. Then, the ends of the mounting terminals 34 formed in the TAB tape 20 are connected to the bumps 18. This connection is preferably formed by flip-chip bonding. Flip-chip bonding utilizes one of two press bonding methods: hot press bonding and ultrasonic bonding. In hot press bonding, a bonding tool 62 and a stage 63 having the SAW resonating reed 10 disposed thereon are heated, thereby heating the connecting portions. The mounting terminals 34 are pressed to the bumps 18 by the bonding tool 62, thereby bonding the mounting terminals 34 to the bumps 18 by hot pressing. In ultrasonic bonding, when the mounting terminals 34 are pressed to the bumps 18 by the bonding tool 62, ultrasonic vibrations are applied, thereby connecting the boundary faces of the mounting terminals 34 and the bumps 18. In this case, the temperature of the components is not as high as in the case of hot press bonding. Accordingly, stress to the SAW resonating reed 10 and the TAB tape 20 is decreased. Either mounting method can be selected depending on the required conditions such as the connecting strength. As described above, the SAW resonating reeds 10 are mounted on the TAB tape 20 successively, thereby forming a tape carrier package (hereinafter referred to as TCP).

According to the first embodiment, the connection of the mounting terminals 34 to the bumps 18 can be performed simultaneously with the formation of the mounting terminals 34 in the TAB tape 20. Specifically, the TAB tape 20 is held at a predetermined distance from the SAW resonating reed 10 having the bumps 18. Then, the mounting terminals 34 are formed with the bonding tool 62 by bending the portion of wiring patterns extending over the windows of the TAB tape 20. Then the mounting terminals 34 are connected to the bumps 18 with the bonding tool 62 by flip-chip bonding. As described above, the TCP is thus formed efficiently.

Referring to FIG. 7(B), in the second step, the TAB tape 20 is installed at the bottom of the cavity of the package base 42. Specifically, bumps 58 are formed on the surface of the mounting electrodes 54 (refer to FIG. 3) on the package base 42 by the apparatus for forming stud bumps using a metal wire. The bumps 58 are formed at the positions corresponding to the ends of the wiring patterns 30 formed on the TAB tape 20. The TCP formed in the first step is cut into pieces of the TAB tape 20. Then the ends of the wiring patterns 30 formed on the TAB tape 20 are connected to the bumps 58. The insulating tape of the TAB tape 20 is pressed and heated by the bonding tool 64, thereby connecting the wiring patterns 30 to the bumps 58 by flip-chip bonding.

Figure 9A:
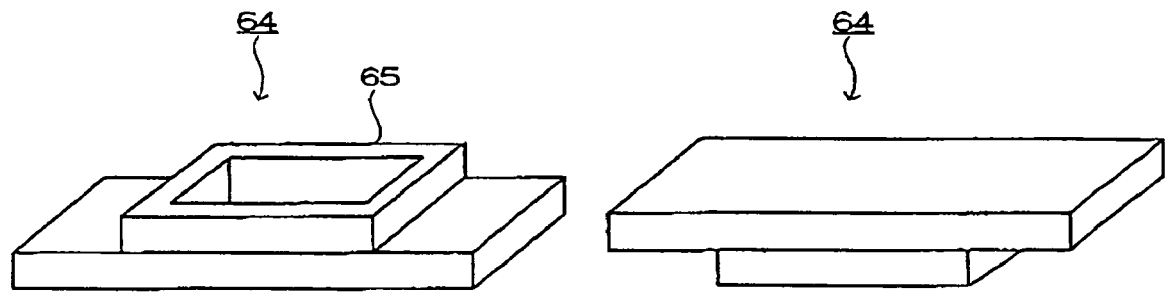
FIGS. 9(A, B & C) include illustrations of a bonding tool.

FIGS. 9(A & B) and (B & C) illustrate a bonding tool. FIG. 9(A)(b) is a perspective view illustrating the bonding tool when used. FIG. 9(A)(a) is an inverted perspective view of the bonding tool shown in FIG. 9(A)(b). Referring to FIG. 9(A), the bonding tool 64 includes a box-shaped pressing portion 65. The outside of the pressing portion 65 is smaller than the inside of the cavity of the package base. The inside of the pressing portion 65 is larger than the outside of the SAW resonating reed. The height of the pressing portion 65 is larger than the depth of the cavity of the package base. The wiring patterns are connected to the bumps by pressing the outer portions of the TAB tape with the above bonding tool.

In the connection process the bonding tool does not interfere with the package base and the SAW resonating reed despite the fact that the outside of the TAB tape has to be larger than the outside of the SAW resonating reed.

Figure 9B:
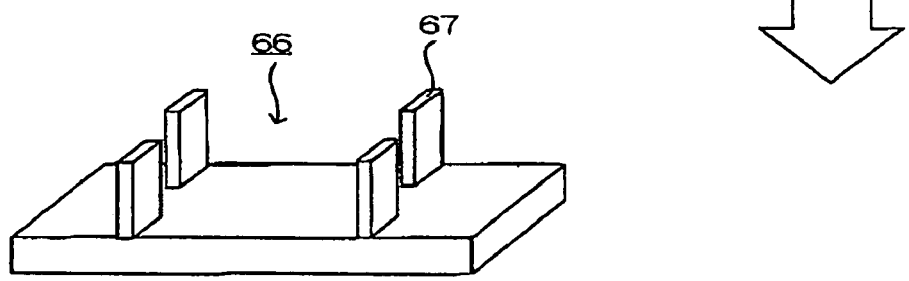
Figure 9C:
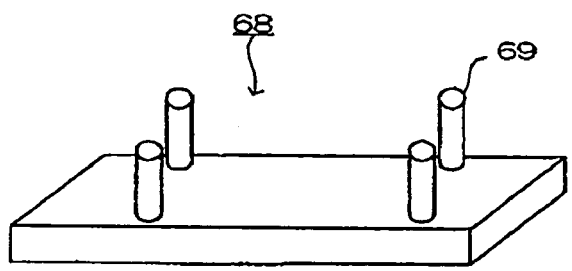

As an alternative to the bonding tool 64 shown in FIG. 9(A), a bonding tool 66 as shown in FIG. 9(B) or a bonding tool 68 as shown in FIG. 9(C) can be used. The bonding tools 66 and 68 include pressing portions 67 and 69 formed only at areas connecting the wiring patterns and the bumps. These bonding tools also connect the wiring patterns with the bumps and do not interfere with the package base and the SAW resonating reed.

Figure 8A:
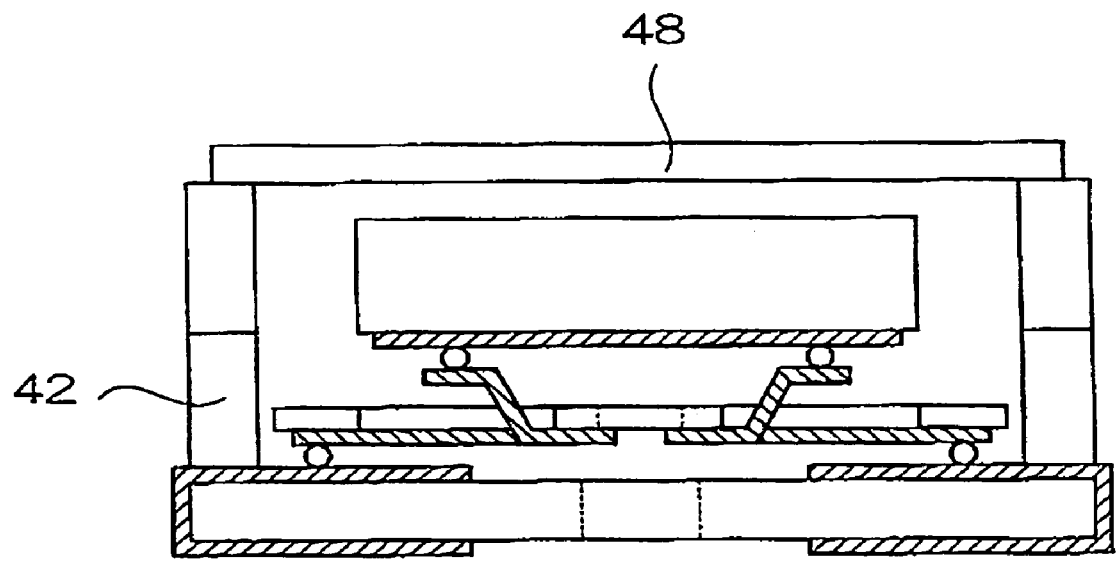
FIGS. 8(A & B) include illustrations of a manufacturing method of the piezoelectric device according to the first embodiment.

Referring to FIG. 8(A), in the third step, a lid 48 is installed on the opening of the cavity of the package base 42. If the lid 48 is composed of glass, the lid and the package base are connected by melting a low-melting-point glass (not shown in the figure) disposed therebetween. If the lid 48 is composed of metal, the package base 42 and the lid 48 are connected by seam welding.

Figure 8B:
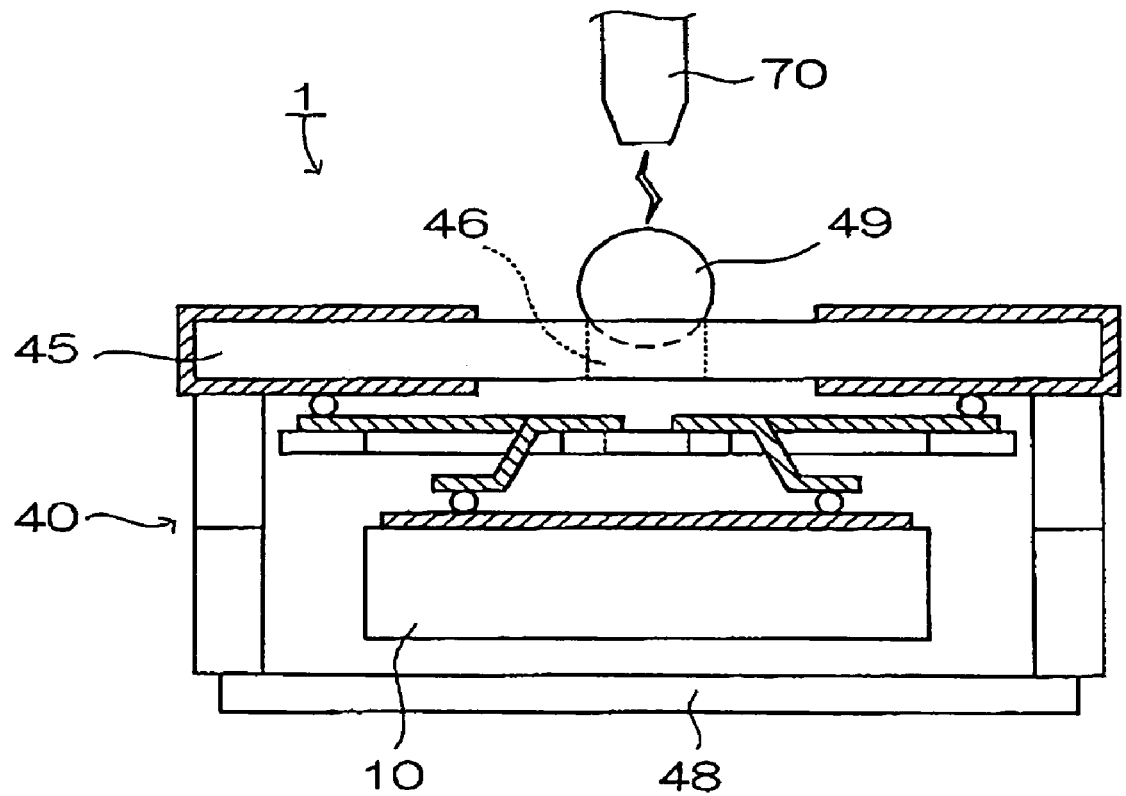

Referring to FIG. 8(B), in the fourth step, a gas such as nitrogen is sealed in the interior of the package 40. Specifically, the gas in the package 40 is substituted by, for example, nitrogen through an open hole 46 formed in the base sheet 45 of the package 40. Then the open hole 46 is sealed with a metal brazing alloy 49. Specifically, a spherical metal brazing alloy 49 composed of, for example, Au/Sn is disposed in the opening of the open hole 46. By irradiation with a laser 70, the melted metal brazing alloy 49 fills the inside of the open hole 46. As described above, a gas such as nitrogen is sealed in the interior of the package 40. If the above third step is performed in, for example, a nitrogen atmosphere, the step of installing the lid 48 and the step of sealing nitrogen inside the package 40 may be carried out at the same time. In that case, the open hole 46 is not required at the base sheet 45 of the package 40.

In the fifth step, the frequency of the SAW resonating reed is adjusted. If the lid 48 is made of glass, laser light is irradiated over the lid 48, thereby ablating the electrode films formed on a SAW resonator (or a piezoelectric device) 1. Accordingly, the resonant frequency of the SAW resonator 1 is adjusted to the desired value. Specifically, adjustment of the depth of the laser focus allows ablation of the electrode films formed on the back side of the SAW resonating reed 10. As described above, the SAW resonating reed is encapsulated in the package and then the frequency of the SAW resonating reed is adjusted. Therefore, a shift in resonant frequency of the SAW resonating reed during encapsulation in the package is prevented. On the other hand, if the lid 48 is composed of metal, dry etching is performed on the SAW resonating reed 10 before the first step to adjust the resonant frequency of the SAW resonating reed 10 to the desired value.

According to the piezoelectric device described in detail in the first embodiment, a common package can be used for different configurations.

According to the piezoelectric device of the first embodiment, the SAW resonating reed is mounted on the package base via the TAB tape composed of an insulating tape having wiring patterns thereon. Since the wiring patterns are formed on the TAB tape, the wiring patterns are not required on the package base. Accordingly, even if a SAW resonating reed having a different electrode structure is mounted, the outer electrodes of the package and the SAW resonating reed can be electrically connected by changing the wiring patterns of the TAB tape. Therefore, a common package can be used.

Using a common package does not require design of new packages. Accordingly, the cost of molds for manufacturing package substrates is reduced. Furthermore, classification of packages is not required, thereby reducing assembling errors. Also, in the manufacturing process of the piezoelectric device, the time required for changing the manufacturing procedure for different products can be shortened, thereby reducing the cost of manufacture. Moreover, the size of trays used for carrying the packages can be unified, thereby reducing the cost of equipment. Furthermore, a plurality of production lines for various products is not required. A reel and a tray for packing the piezoelectric vibrators when shipping can be also unified, thereby reducing the cost of equipment.

According to the first embodiment, the SAW resonating reed is mounted on the mounting terminals formed by raising part of the wiring patterns from the surface of the insulating tape. Even if an impact force is applied to the SAW resonating reed, the mounting terminals function as buffers. Accordingly, connection breakage in the SAW resonating reed does not occur. Furthermore, even if the rates of expansion and the rates of contraction of the SAW resonating reed and the package are different, due to the difference of the coefficients of linear expansion, the flexible mounting terminals absorb the difference of the rates of expansion and the rates of contraction. Accordingly, shear stress does not act on the bonded portion, thereby preventing connection breakage. Furthermore, stress is not applied from the package to the SAW resonating reed, thereby preventing deterioration of the frequency characteristics.

The stiffness of the TAB tape is varied by changing the material composition of the insulating tape and the material composition of the metal foil, both of which compose the TAB tape. As described above, support state of the SAW resonating reed can be adjusted. The support state of the SAW resonating reed is adjusted by modifying the shape of the mounting terminal. Furthermore, the support state of the SAW resonating reed is adjusted by modifying the material of the bumps and the shape of the bumps.

The installation of the TAB tape in the package base and the mounting of the SAW resonating reed on the TAB tape are performed with bumps. Since the bumps do not give off impurity gases, the shift of the resonant frequency of the SAW resonating reed due to the deposition of impurity gas thereon is prevented.

The method for manufacturing a piezoelectric device according to the first embodiment includes the first step of mounting the SAW resonating reed on the TAB tape and the second step of installing the TAB tape having the SAW resonating reed mounted thereon in the package base. According to this method, the SAW resonating reeds are successively mounted on an elongated strip of TAB tape, thereby efficiently manufacturing SAW resonators.

According to the first embodiment, a SAW resonator having a SAW resonating reed mounted thereon is exemplified; however, the present invention can also be applied to piezoelectric devices having other piezoelectric vibrating reeds mounted thereon. For example, the present invention can be applied to a SAW filter having a SAW resonating reed mounted thereon, a piezoelectric vibrator having an AT-cut piezoelectric vibrating reed, a piezoelectric vibrator having a tuning-fork-type piezoelectric vibrating reed mounted thereon, and an angular velocity sensor having a piezoelectric vibrating reed mounted thereon. A piezoelectric vibrator having a tuning-fork-type piezoelectric vibrating reed mounted thereon will now be described as a modification of the first embodiment.

Figure 10A:
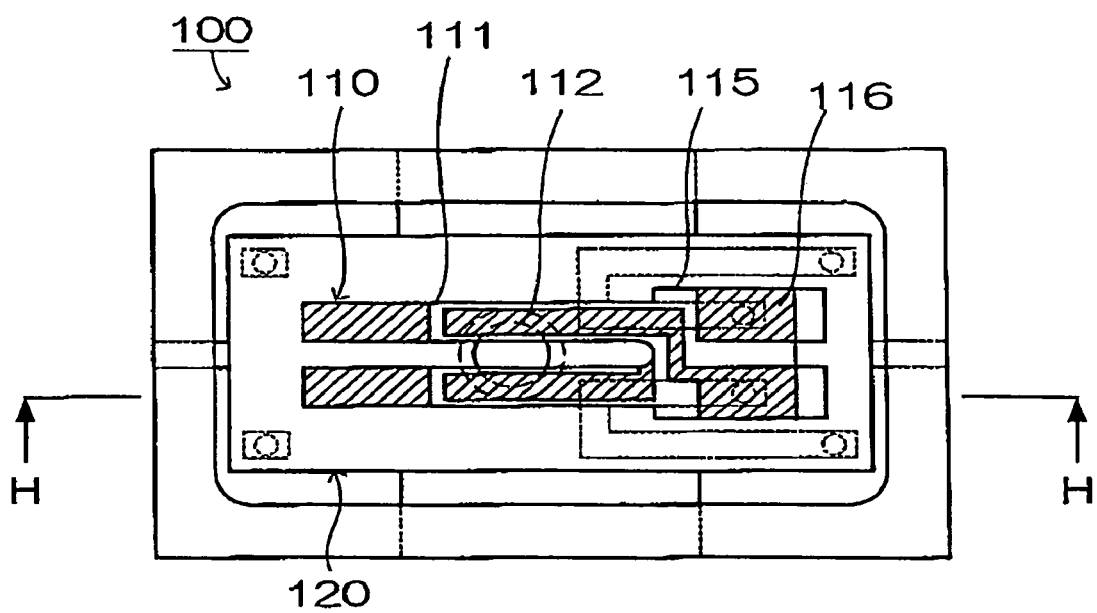
FIGS. 10(A & B) include illustrations of a piezoelectric device according to a modification of the first embodiment.
Figure 10B:
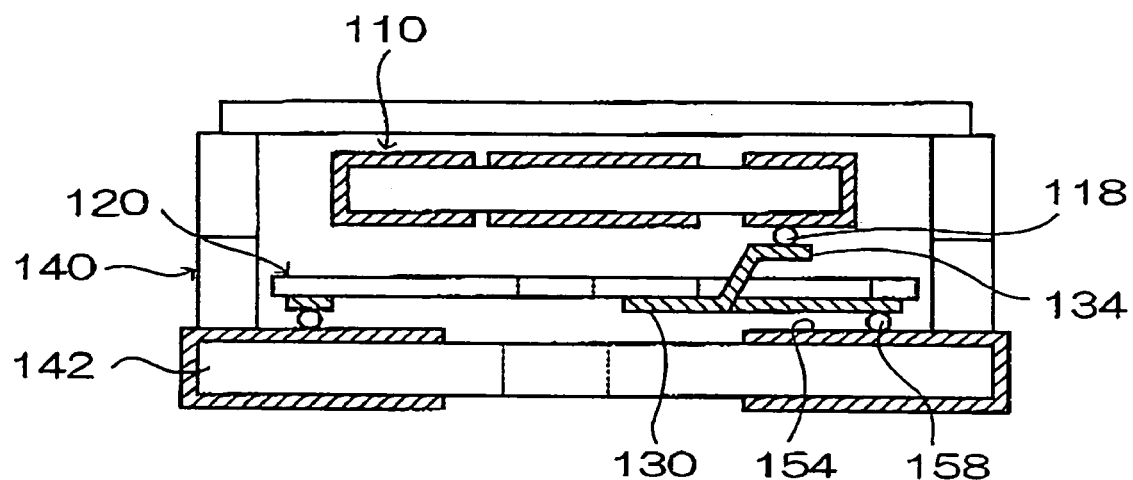

FIGS. 10(A & B) illustrate a piezoelectric device having a tuning-fork-type piezoelectric vibrating reed mounted thereon. FIG. 10(A) is a plan view of a piezoelectric device, a lid thereof being removed. FIG. 10(B) is a side sectional view taken along line H—H of FIG. 10(A). According to a tuning-fork-type piezoelectric vibrating reed 110, two vibrating arms 111 extending from a base of the tuning fork 115 bend and vibrate. Excitation electrodes 112 are formed on the surface of the vibrating arms 111, and connecting electrodes 116 which connect to the excitation electrodes 112 are formed on the surface of the base of the tuning fork 115. The structure of a package 140 having a package base 142 the same as that of the first embodiment is shown in FIG. 10 with the package base 142 formed to be small so as to fit to the outer shape of the tuning-fork-type piezoelectric vibrating reed 110 and otherwise unchanged from the package base 42 shown in FIG. 3.

Figure 11A:
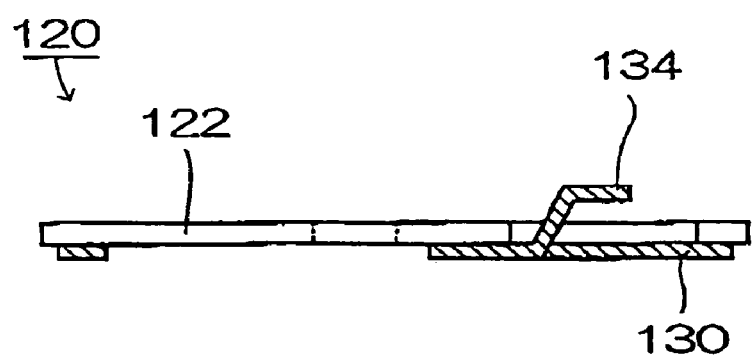
FIGS. 11(A & B) include illustrations of the TAB tape.
Figure 11B:
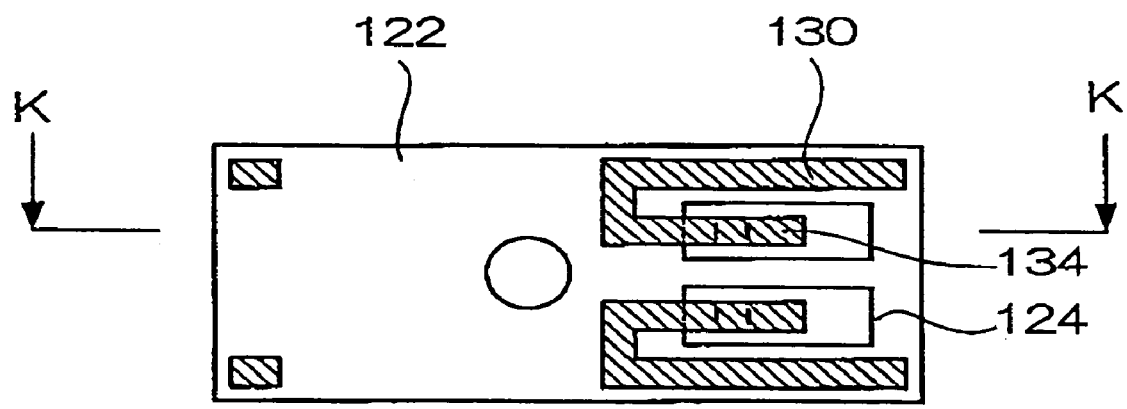

FIGS. 11(A & B) illustrate a TAB tape for the piezoelectric device of FIG. 10. FIG. 11(A) is a side sectional view taken along line K—K of FIG. 11(B) and FIG. 11(B) is a bottom plan view of the piezoelectric device. A TAB tape 120 shown in FIG. 11 is composed of an insulating tape 122 having wiring patterns 130 formed thereon, as described in forming the TAB tape 20 shown in FIG. 4. In the insulating tape 122, rectangular windows 124 are formed at positions coincident to the connecting electrodes 116 of the tuning-fork-type piezoelectric vibrating reed 110 for mounting the vibrating reed 110 upon the TAB tape 120. Wiring patterns 130 are formed to lie along the outside of the long sides of the windows 124. The wiring patterns 130 are linearly formed from the periphery to the center of the insulating tape 122, and are formed to extend to the inside of short sides of the windows 124 such that the shape of the wiring pattern 130 forms a U shape curvature as was formed in TAB tape 20. Then the wiring patterns are raised to the back side of the insulating tape 122 passing through the windows 124, thereby forming mounting terminals 134. The specific method for forming the wiring pattern 130 is the same as discussed heretofore in connection with the first embodiment.

A piezoelectric device 100 shown in FIGS. 10(A & B) comprises the above piezoelectric vibrating reed 110, the package base 142, and the TAB tape 20. The specific method for manufacturing the piezoelectric device is the same as that described heretofore in connection with the first embodiment. In the first step, bumps 118 are formed on the connecting electrodes 116 of the tuning-fork-type piezoelectric vibrating reed 110, and this is connected to the mounting terminals 134 formed on the TAB tape 120. In the second step, bumps 158 are formed on the mounting electrodes 154 of the package base 142, and this is connected with the ends of the wiring patterns 130 formed on the TAB tape 120.

According to the above modification of the first embodiment, the mounting terminals 134 are raised from the center to above the periphery of the insulating tape 120. The connecting electrodes 116 formed at the ends of the piezoelectric vibrating reed 110 are connected to the ends of the mounting terminals 134 via bumps 118. Accordingly, all mounting terminals 134 are disposed at the lower part of the piezoelectric vibrating reed 110. Therefore, space is efficiently used compared with the case where the mounting terminals 134 are raised from the periphery to the center of the TAB tape 120. Therefore, the piezoelectric device 100 can be reduced in size.

Figure 12:
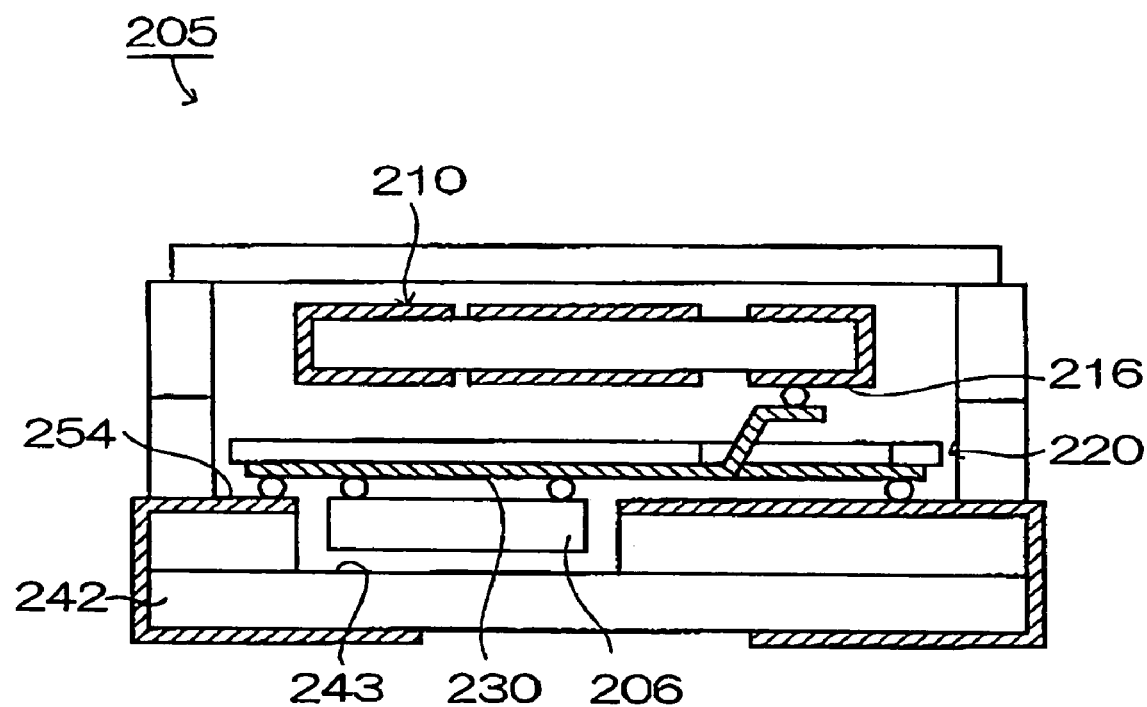
FIG. 12 includes an illustration of a piezoelectric oscillator.

FIG. 12 illustrates a piezoelectric oscillator having an integrated circuit, i.e., an IC. FIG. 12 is a side sectional view, as in FIG. 10(B). The present invention is also applied to a piezoelectric oscillator 205 having an integrated circuit 206. On a TAB tape 220 shown in FIG. 12, connecting electrodes 216 of a piezoelectric vibrating reed 210 and the integrated circuit 206 are connected. Wiring patterns 230 for connecting mounting electrodes 254 of a package base 242 and the integrated circuit 206 are also formed on the TAB tape 220. The integrated circuit 206 is mounted on the wiring patterns 230 by a method such as flip-chip bonding.

Specifically, bumps are formed on electrode pads of the integrated circuit 206 by an apparatus for forming stud bumps using a metal wire. Then the bumps are connected to wiring patterns 230 formed on the TAB tape 220 by flip-chip bonding, thereby connecting the integrated circuit 206 with the TAB tape 220. The wiring patterns 230 for connecting the integrated circuit 206 are formed in advance on the TAB tape 220 as explained earlier in connection with FIGS. 5 and 6. A portion of the wiring patterns extending over the windows of the TAB tape 220 are bent, and the bent wiring patterns are raised toward the back side of the insulating tape after passing through the windows, thereby forming mounting terminals for connecting the piezoelectric vibrating reed 210. Furthermore, bumps are formed on the connecting electrodes 216 of the piezoelectric vibrating reed 210 by the apparatus for forming stud bumps using a metal wire. The connecting electrodes 216 are connected to the mounting terminals extending from the TAB tape 220 via the bumps by flip-chip bonding, thereby connecting the piezoelectric vibrating reed 210 with the TAB tape 220. The connections of each component are thus completed as described above. A recess 243 is formed in the package base 242 to prevent interference with the integrated circuit 206.

As described above, the integrated circuit 206 is mounted in the package, thereby manufacturing the piezoelectric oscillator 205. The recess 243 formed in the piezoelectric oscillator 205 prevents interference between integrated circuit 206 and the package base 242. Accordingly, not only reduced-size but also low-profile piezoelectric oscillators 205 can be achieved. Furthermore, since the piezoelectric vibrating reed 210 and the integrated circuit 206 are mounted on the TAB tape 220, the interconnection length of the piezoelectric vibrating reed 210 and the integrated circuit 206 is minimized. Printed wiring and bonding wires are not required; therefore, the cost can be reduced.

A second embodiment of the present invention will now be described.

Figure 13A:
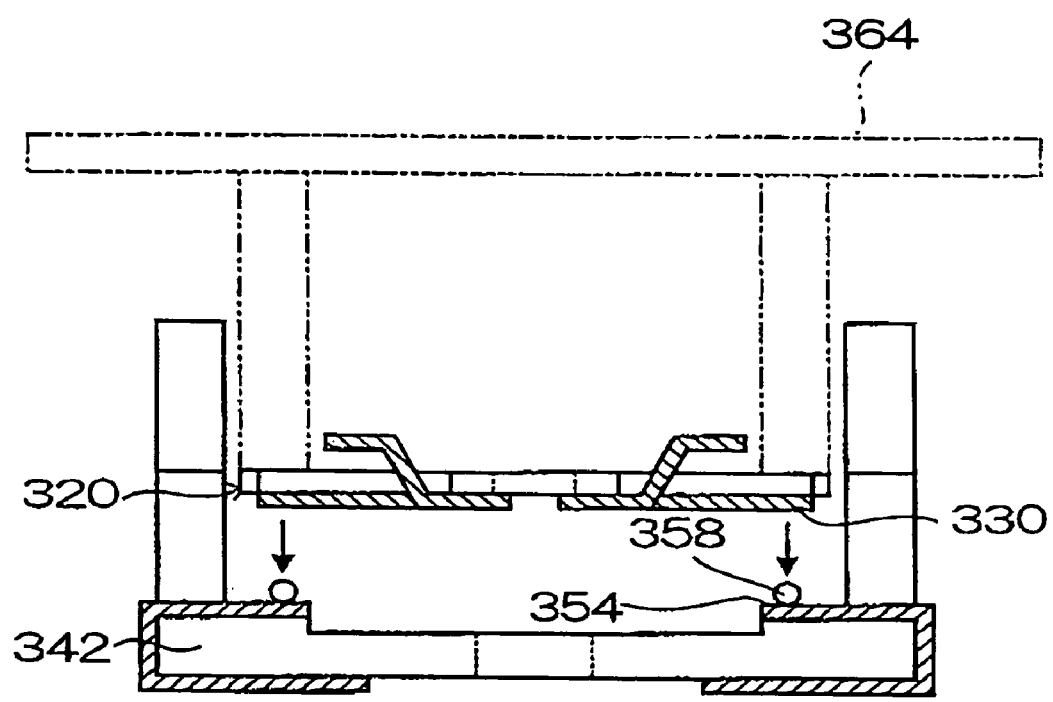
FIGS. 13(A & B) include illustrations of a manufacturing method of the piezoelectric device according to a second embodiment.
Figure 13B:
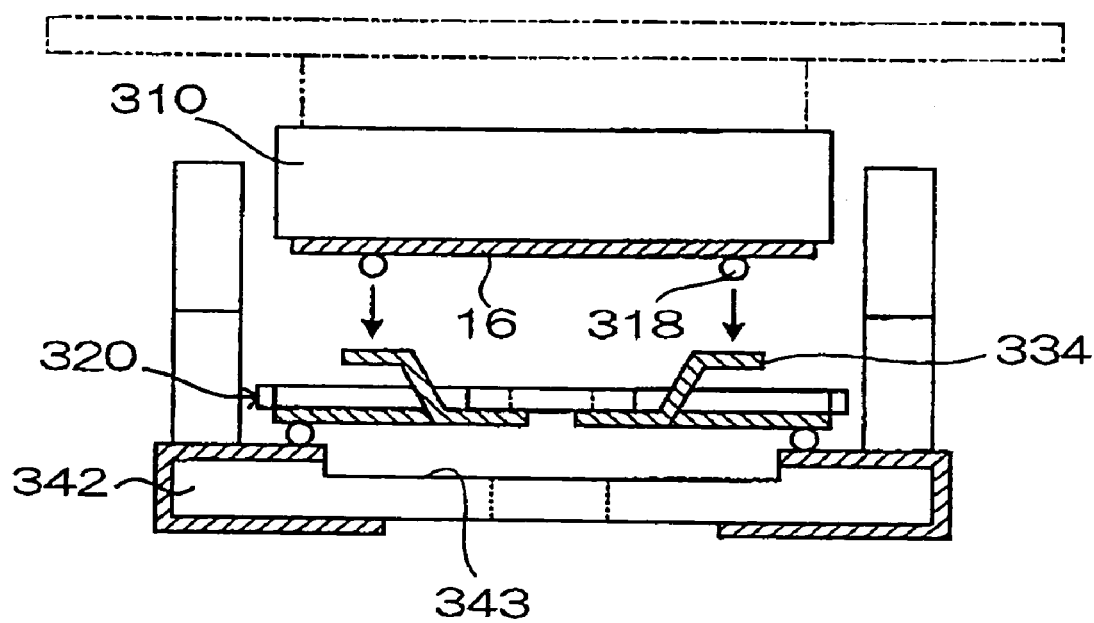
Figure 14A:
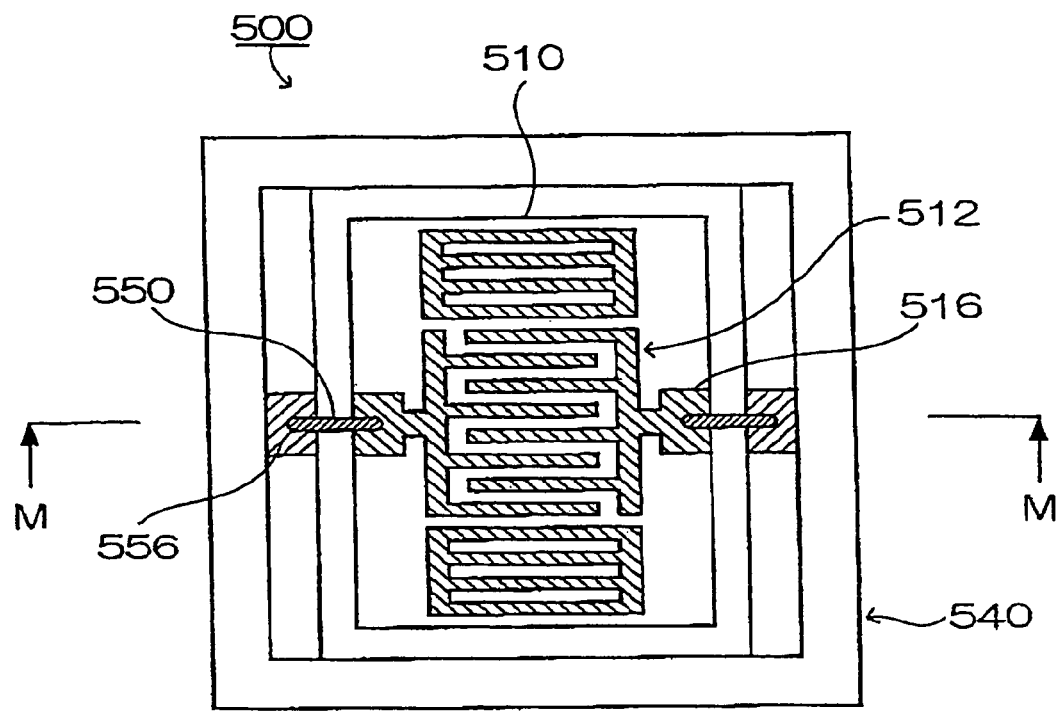
FIGS. 14(A & B) include illustrations of a SAW resonator according to the conventional art.
Figure 14B:
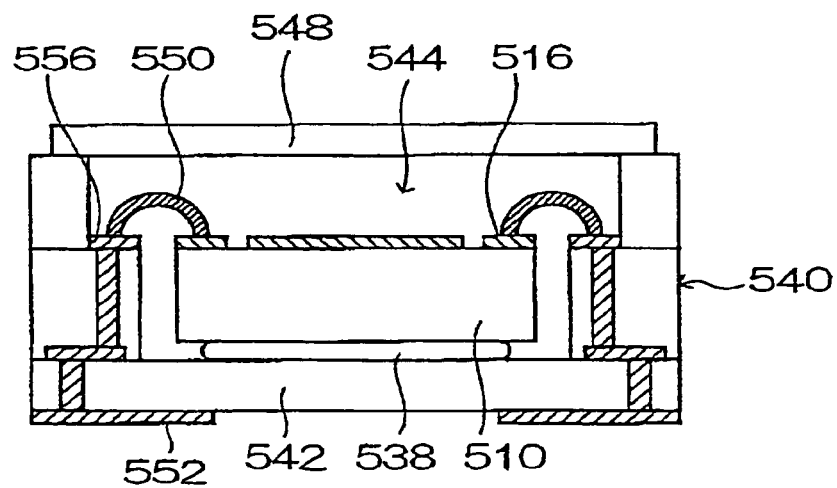
Figure 15A:
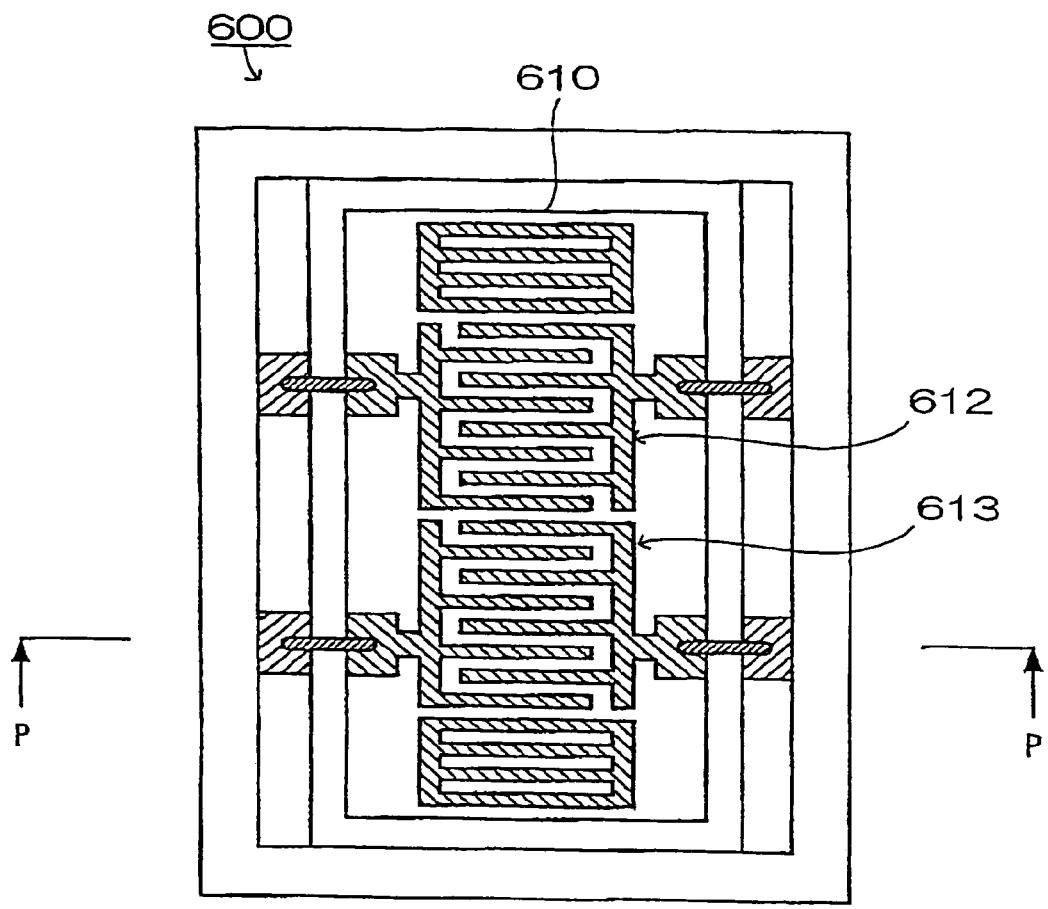
FIGS. 15(A & B) include illustrations of a SAW filter according to the conventional art.
Figure 15B:
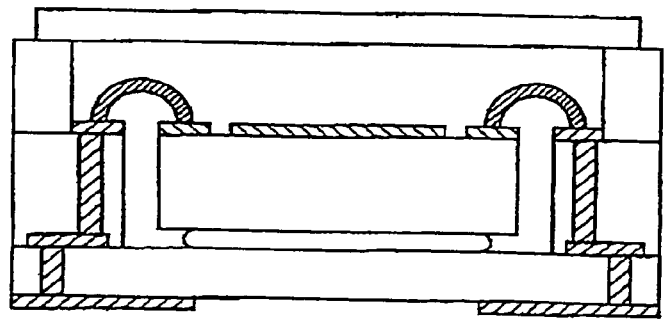

FIGS. 13(A & B) illustrate a method for manufacturing the piezoelectric device according to the second embodiment. FIGS. 13(A) and 13(B) are side sectional views, similar to FIGS. 7(A & B). An outline of the manufacturing method of the piezoelectric device according to the second embodiment includes a first step of installing a TAB tape 320 having wiring patterns 330 formed thereon in the bottom of a cavity of a package base 342, and a second step of mounting a piezoelectric vibrating reed (or a SAW resonating reed) 310 on mounting terminals 334 formed on the TAB tape 320. Processes that are similar to the first embodiment are not described.

Referring to FIG. 13(A), in the first step, the TAB tape 320 is installed in the bottom of the cavity of the package base 342. According to the second embodiment, the TAB tape 320 is installed in the package base 342 before the piezoelectric vibrating reed 310 is mounted on the TAB tape 320. Specifically, bumps 358 are formed on the mounting electrodes 354 formed on the package base 342 by an apparatus for forming stud bumps using a metal wire. The bumps 358 are formed at the position corresponding to the ends of the wiring patterns 330 formed on the TAB tape 320. Then, the bumps 358 are connected to the ends of the wiring patterns 330 formed on the TAB tape 320. The insulating TAB tape 320 is then pressed and heated by the bonding tool 364, thereby connecting the wiring patterns 330 to the bumps 358 by flip-chip bonding. Other specific methods are the same as those of the first embodiment.

Referring to FIG. 13(B), in the second step, the SAW resonating reed 310 is mounted on the mounting terminals 334 formed on the TAB tape 320. Specifically, bumps 318 are formed on the surface of the electrode pads 16 (refer to FIG. 2) formed on the SAW resonating reed 310 by the apparatus for forming stud bumps using a metal wire. The bumps 318 are formed at positions corresponding to the ends of the mounting terminals 334 formed on the TAB tape 320. Then the bumps 318 are connected to the mounting terminals 334 formed on the TAB tape 320. According to the second embodiment, the bonding tool 62 shown in FIG. 7(A) cannot be used for the above press bonding. Therefore, the SAW resonating reed having bumps 318 is connected to the mounting terminals 334 by flip-chip bonding. A recess 343 is formed on the surface of the package base 342, and the position of the recess 343 corresponds to the position of the mounting terminals 334. Accordingly, when the SAW resonating reed 310 is mounted on the mounting terminals 334, the mounting terminals 334 are not deformed by pressure from the package base 342. After the mounting is completed, the shapes of the mounting terminals 334 return to their initial elastic supporting shape.

The third step and subsequent steps are performed as in the first embodiment. Thus, the piezoelectric device is completed.

According to the first embodiment, the SAW resonating reed is mounted on the TAB tape, and then the TAB tape is installed in the package base. Therefore, the outer shape of the TAB tape has to be larger than the outer shape of the SAW resonating reed. Accordingly, the reduction in size of the piezoelectric device is limited. According to the manufacturing method of the second embodiment, substantial reduction in size of the piezoelectric device can be achieved.

The manufacturing method of the second embodiment includes the first step of installing the TAB tape having wiring patterns in the bottom of the cavity of the package base, and the second step of mounting the piezoelectric vibrating reed on the mounting terminals formed on the TAB tape. The TAB tape is installed in the package base and then the SAW resonating reed is mounted on the TAB tape. Therefore, the outer shape of the TAB tape does not have to be larger than the outer shape of the SAW resonating reed. As a result, the outer shape of the TAB tape can be the same as the outer shape of the SAW resonating reed. Accordingly, a so-called chip-size package is obtained and a reduction in size of the SAW resonating reed is achieved.

The entire disclosure of Japanese Patent Application No. 2002-314321 filed Oct. 29, 2002 is incorporated by reference herein.

The invention claimed is:

1. A piezoelectric device comprising:
   a piezoelectric vibrating reed having excitation electrodes,
   a package with outer terminals into which the piezoelectric vibrating reed is mounted; and
   a strip of insulating material having electrical conductors in the form of wiring patterns disposed thereon for forming an insulating bonding ("TAB") tape, with said TAB tape being interposed in said package such that the excitation electrodes of said piezoelectric vibrating reed are interconnected to the outer terminals of the package through the conductive wiring patterns on said TAB tape, wherein said TAB tape includes a opening or a plurality of openings in the form of windows extending therethrough;

wherein the wiring patterns are formed on a surface of insulating tape facing mounting electrodes;

wherein the wiring patterns are formed on the surface of the insulating tape with portions of the wiring patterns overlying the windows; and wherein the piezoelectric vibrating reed is mounted on the TAB tape with the excitation electrodes connected to the wiring pattern via said windows.

2. The piezoelectric device according to claim 1, wherein said TAB tape includes mounting terminals upon which the piezoelectric vibrating reed is mounted with said mounting terminals composed of a portion of said wiring patterns extended from said surface for connection to said excitation electrodes.

3. The piezoelectric device according to claim 2, wherein the mounting terminals are located in an elevated plane spaced apart from the plane of said TAB tape.

4. The piezoelectric device according to claim 1, wherein the TAB tape is connected to the piezoelectric vibrating reed in the package by means of bumps of conductive material or solder.

5. A piezoelectric device comprising:

a piezoelectric vibrating reed having excitation electrodes, a package with outer terminals into which the piezoelectric vibrating reed is mounted; and a strip of insulating material having electrical conductors in the form of wiring patterns disposed thereon for forming an insulating bonding ("TAB") tape, with said TAB tape being interposed in said package such that the excitation electrodes of said piezoelectric vibrating reed are interconnected to the outer terminals of the package through the conductive wiring patterns on said TAB tape, wherein said TAB tape includes mounting terminals upon which the piezoelectric vibrating reed is mounted with said mounting terminals composed of a portion of said wiring patterns extended from said surface for connection to said excitation electrodes.

6. The piezoelectric device according to claim 5, wherein the mounting terminals are located in an elevated plane spaced apart from the plane of said TAB tape.

7. The piezoelectric device according to claim 5, wherein the TAB tape is connected to the piezoelectric vibrating reed in the package by means of bumps of conductive material or solder.

* * * * *